(12) United States Patent
Ji et al.

(10) Patent No.: US 11,990,201 B2
(45) Date of Patent: *May 21, 2024

(54) STORAGE SYSTEM

(71) Applicant: CHANGXIN MEMORY TECHNOLOGIES, INC., Hefei (CN)

(72) Inventors: Kangling Ji, Hefei (CN); Jun He, Hefei (CN); Yuanyuan Gong, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/657,942

(22) Filed: Apr. 4, 2022

(65) Prior Publication Data

US 2022/0230701 A1 Jul. 21, 2022

Related U.S. Application Data

(63) Continuation of application No. PCT/CN2021/111426, filed on Aug. 9, 2021.

(30) Foreign Application Priority Data

Jan. 14, 2021 (CN) .......................... 202110049107.5

(51) Int. Cl.
*G11C 29/44* (2006.01)
*G11C 29/12* (2006.01)
(Continued)

(52) U.S. Cl.
CPC .... *G11C 29/4401* (2013.01); *G11C 29/12005* (2013.01); *G11C 29/18* (2013.01); *H03K 19/21* (2013.01); *G11C 2029/1802* (2013.01)

(58) Field of Classification Search
CPC .......... G11C 29/4401; G11C 29/12005; G11C 29/18; G11C 2029/1802; G11C 2029/0411; H03K 19/21; G06F 11/1048
(Continued)

(56) References Cited

U.S. PATENT DOCUMENTS

| 4,736,376 A | 4/1988 | Stiffler |
| 4,749,886 A | 6/1988 | Hedayati |

(Continued)

FOREIGN PATENT DOCUMENTS

| CN | 1242088 A | 1/2000 |
| CN | 1881477 A | 12/2006 |

(Continued)

OTHER PUBLICATIONS

Notice of Allowance of the U.S. Appl. No. 17/668,715, issued on Jun. 16, 2023. 40 pages.
(Continued)

*Primary Examiner* — James C Kerveros
(74) *Attorney, Agent, or Firm* — Syncoda LLC; Feng Ma

(57) ABSTRACT

A storage system includes: a memory, configured to write or read a plurality of pieces of data during a read-write operation, the plurality of pieces of data being divided into M bytes, and each byte having N pieces of data; and an encoding circuit, configured to in the encoding stage, generate X first check codes based on the two or more pieces of data in each byte, generate Y second check codes based on all data of two or more bytes of the M bytes in the encoding stage, and generate a third check code based on the plurality of pieces of data, the X first check codes and the Y second check codes. The first check codes, the second check codes and the third check code are used to determine an error state of the plurality of pieces of data.

20 Claims, 6 Drawing Sheets

(51) Int. Cl.
   *G11C 29/18* (2006.01)
   *H03K 19/21* (2006.01)

(58) Field of Classification Search
   USPC .......................................................... 714/763
   See application file for complete search history.

(56) References Cited

U.S. PATENT DOCUMENTS

| | | | |
   |---|---|---|---|
   | 5,859,858 | A | 1/1999 | Leeman |
   | 5,936,870 | A | 8/1999 | Im |
   | 6,891,690 | B2 | 5/2005 | Asano |
   | 7,242,219 | B1 | 7/2007 | Mahurin |
   | 7,653,862 | B2 | 1/2010 | Hassner |
   | 8,225,175 | B2 | 7/2012 | Chen |
   | 8,560,916 | B2 | 10/2013 | Yang |
   | 8,862,963 | B2 | 10/2014 | Nakanishi |
   | 9,411,686 | B2 | 8/2016 | Yang et al. |
   | 9,754,684 | B2 | 9/2017 | Hu et al. |
   | 9,985,655 | B2 | 5/2018 | Jeganathan et al. |
   | 9,985,656 | B2 | 5/2018 | Jeganathan et al. |
   | 11,239,944 | B1* | 2/2022 | Pan ..................... H03M 13/251 |
   | 11,599,417 | B2 | 3/2023 | Ji |
   | 2004/0095666 | A1 | 5/2004 | Asano |
   | 2005/0273678 | A1 | 12/2005 | Dietrich |
   | 2007/0011598 | A1 | 1/2007 | Hassner |
   | 2009/0106633 | A1 | 4/2009 | Fujiwara |
   | 2010/0185904 | A1* | 7/2010 | Chen ................... G06F 12/0895 |
   | | | | 711/E12.001 |
   | 2011/0191651 | A1 | 8/2011 | Chen |
   | 2011/0239082 | A1 | 9/2011 | Tsung-Chieh |
   | 2012/0311408 | A1 | 12/2012 | Nakanishi |
   | 2015/0058700 | A1 | 2/2015 | Yang et al. |
   | 2015/0143201 | A1 | 5/2015 | Coteus |
   | 2017/0060677 | A1 | 3/2017 | Jeganathan et al. |
   | 2017/0060679 | A1 | 3/2017 | Jeganathan et al. |
   | 2017/0222664 | A1 | 8/2017 | Tsuboi |
   | 2017/0353271 | A1 | 12/2017 | Kudekar et al. |
   | 2018/0060166 | A1* | 3/2018 | Lee ..................... G06F 11/1068 |
   | 2018/0205498 | A1 | 7/2018 | Kudekar et al. |
   | 2019/0034270 | A1 | 1/2019 | Byun et al. |
   | 2019/0146870 | A1* | 5/2019 | Cha .................. H03M 13/2906 |
   | | | | 714/755 |
   | 2019/0280817 | A1 | 9/2019 | Kudekar et al. |
   | 2022/0223186 | A1 | 7/2022 | Ji |
   | 2022/0223221 | A1 | 7/2022 | Ji |
   | 2022/0230701 | A1* | 7/2022 | Ji ........................... G11C 29/18 |

FOREIGN PATENT DOCUMENTS

| | | |
   |---|---|---|
   | CN | 101183565 A | 5/2008 |
   | CN | 101980339 A | 2/2011 |
   | CN | 102339641 A | 2/2012 |
   | CN | 102543209 A | 7/2012 |
   | CN | 102810336 A | 12/2012 |
   | CN | 102857217 A | 1/2013 |
   | CN | 103078629 A | 5/2013 |
   | CN | 104425019 A | 3/2015 |
   | CN | 105471425 A | 4/2016 |
   | CN | 105471425 B | 5/2018 |
   | CN | 108038023 A | 5/2018 |
   | CN | 109036493 A | 12/2018 |
   | CN | 109308228 A | 2/2019 |
   | CN | 110968450 A | 4/2020 |
   | CN | 111443887 A | 7/2020 |
   | JP | S61277230 A | 12/1986 |
   | JP | S63102510 A | 5/1988 |
   | JP | H07212222 A | 8/1995 |
   | JP | 2010079485 A | 4/2010 |
   | JP | 2012022422 A | 2/2012 |
   | JP | 2013074560 A | 4/2013 |

OTHER PUBLICATIONS

Notice of Allowance of the Japanese application No. 2022-538835, issued on Aug. 8, 2023. 3 pages with English translation.
   First Office Action of the U.S. Appl. No. 17/627,013, issued on Jun. 8, 2023. 38 pages.
   Supplementary European Search Report in the European application No. 21863077.0, mailed on Jun. 29, 2023. 8 pages.
   First Office Action of the Japanese application No. 2022-538713, issued on Aug. 1, 2023. 8 pages with English translation.
   First Office Action of the Japanese application No. 2022-538785, issued on Aug. 22, 2023, 5 pages with English translation.
   First Office Action of the Korean application No. 10-2022-7021376, issued on Nov. 27, 2023, 12 pages with English Translation.
   Non-Final Office Action of the U.S. Appl. No. 17/669,565, issued on Oct. 19, 2023, 40 pages.

* cited by examiner

FIG. 2

| Byte | 0 | | | | | | | |
|------|---|---|---|---|---|---|---|---|
| Bit | 0 | 1 | 2 | 3 | 4 | 5 | 6 | 7 |
| pc0 |   | × |   | × |   | × |   | × |
| pc1 |   |   | × | × |   |   | × | × |
| pc2 |   |   |   |   | × | × | × | × |

| Byte | 0 | 1 | 2 | 3 | 4 | 5 | 6 | 7 | 15 | 14 | 13 | 12 | 11 | 10 | 9 | 8 |
|---|---|---|---|---|---|---|---|---|---|---|---|---|---|---|---|---|
| pc3 | × |   | × | × | × | × | × |   |   |   |   |   |   |   |   | × |
| pc4 | × | × |   |   | × | × |   | × |   |   |   | × |   | × | × |   |
| pc5 |   | × | × |   | × |   | × |   |   | × | × |   | × |   | × |   |
| pc6 |   |   |   | × |   | × | × | × | × | × |   |   | × | × |   |   |
| pc7 |   |   |   |   |   |   |   |   | × |   | × | × | × | × | × | × |

STORAGE SYSTEM

CROSS-REFERENCE TO RELATED APPLICATIONS

This is a continuation of International Patent Application No. PCT/CN2021/111426 filed on Aug. 9, 2021, which claims priority to Chinese Patent Application No. 202110049107.5 filed on Jan. 14, 2021. The disclosures of these applications are hereby incorporated by reference in their entirety.

BACKGROUND

Semiconductor storage may include nonvolatile storage and volatile storage. A Dynamic Random Access Memory (DRAM), serving as the volatile storage, has the advantages of high storage density, fast read-write speed, and the like, and is widely applied to various electronic systems.

With the more advanced manufacturing process and higher storage density of the DRAM, errors may occur in stored data in the DRAM, which may seriously influence the performance of the DRAM. Therefore, an Error Checking and Correction or Error correction Coding (ECC) technology is usually applied to the DRAM to detect or correct the errors in the stored data.

SUMMARY

Embodiments of the present disclosure relate, but are not limited, to a storage system.

The embodiments of the present disclosure provide a storage system including: a memory, configured to write or read a plurality of pieces of data during a read-write operation, the plurality of pieces of data being divided into M bytes, and each byte having N pieces of data; and an encoding circuit, configured to: generate X first check codes based on two or more pieces of data of the plurality of pieces of data in each byte in an encoding stage, bits where the two or more pieces of data corresponding to a same first check code locate being identical in different bytes; generate Y second check codes based on all data of two or more bytes of the M bytes in the encoding stage; and generate a third check code based on the plurality of pieces of data, the X first check codes and the Y second check codes; wherein the X first check codes, the Y second check codes and the third check code are used to determine an error state of the plurality of pieces of data; and wherein when the plurality of pieces of data have a 1-bit error, the Y second check codes are used to locate a specific byte to which the 1-bit error belongs, and the X first check codes are used to locate a specific bit to which the 1-bit error belongs; and wherein M, N, X, and Y are all positive natural numbers.

BRIEF DESCRIPTION OF THE DRAWINGS

One or more embodiments are exemplified by the figures in the corresponding drawings. These exemplary descriptions do not constitute a limitation on the embodiments. Elements with the same reference numerals in the drawings are denoted by similar elements. Unless otherwise stated, the figures in the drawings do not constitute a proportion limit.

FIG. 2 is a classification diagram of a plurality of pieces of data and a relation among first check codes, second check codes and third check codes according to an embodiment of the present disclosure.

DETAILED DESCRIPTION

The implementation of the present disclosure provides a storage system. In an encoding stage, an encoding circuit acquires a check code for error detection and/or error correction of a byte and a check code for error detection and/or error correction of different bits in the byte, respectively, which facilitates simplification of a hardware circuit, reduction of the power consumption of the storage system and improvement of the encoding speed while realizing the ECC technology.

To make the objectives, technical solutions, and advantages of the embodiments of the present application clearer, various embodiments of the present application are described below in detail with reference to the accompanying drawings. However, it is to be understood by those of ordinary skill in the art that in the various embodiments of the present disclosure, many technical details have been proposed in order to make a reader better understand the present disclosure. However, even without these technical details and various variations and modifications based on the following embodiments, the technical solutions claimed in the present disclosure may also be implemented.

Figure 1:
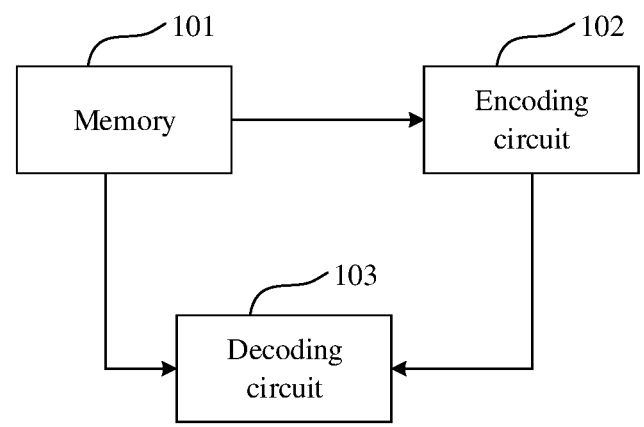
FIG. 1 is a functional block diagram of a storage system according to an embodiment of the present disclosure.

FIG. 1 is a functional block diagram of a storage system according to an embodiment of the present disclosure.

Referring to FIG. 1, in the embodiment, the storage system may include a memory 101, configured to write or read a plurality of pieces of data during a read-write operation, the plurality of pieces of data being divided into M bytes, and each byte having N pieces of data; and an encoding circuit 102. The encoding circuit 102 is configured to: in the encoding stage, generate X first check codes based on the two or more pieces of data in each byte. The bits where the two or more pieces of data corresponding to the same first check code locate are the same in different bytes. The encoding circuit 102 is configured to: in the encoding stage, generate Y second check codes based on all data of two or more bytes of the M bytes, and generate a third check code based on the plurality of pieces of data, the X first check codes and the Y second check codes. The X first check codes, the Y second check codes and the third check code are used to determine an error state of the plurality of pieces of data; and when the plurality of pieces of data have a 1-bit error, the Y second check codes are used to locate a specific byte to which the 1-bit error belongs, and the X first check codes are used to locate a specific bit to which the 1-bit error belongs. M, N, X and Y are all positive natural numbers.

The embodiments provide a novel storage system. Data is divided into different bytes. A first check code is used for error detection and/or error correction of N pieces of data in each byte. A second check code is used for error detection and/or error correction of M bytes. This error detection and error correction encoding method can not only implement ECC, but also implement ECC with fewer hardware circuits, which facilitates reduction of the power consumption of the storage system and optimization of the speed and results of ECC. Additionally, a third check code, the second check code and the first check code are jointly used to determine the number of error bits, which facilitates improvement of the error detection/error correction ability of the storage system. It is to be noted that the operation of judging the number of error bits in the embodiment is mainly used to determine a 0-bit error, a 1-bit error and a 2-bit error, but it is not limited thereto.

The storage system provided by the embodiment will be described in detail with reference to the accompanying drawings.

In the embodiment, the memory 101 is a DRAM, for example, which may be DDR4, LPDDR4, DDR5 or LPDDR5. In another embodiment, the memory may also be another type of memory, for example, a non-volatile memory such as NAND, NOR, FeRAM, PcRAM, and the like.

Generally, bytes are basic units of data processing. Information is stored and interpreted in bytes. It is specified that one byte is composed of 8 binary bits, that is, one byte is equal to 8 bits, and each bit in the 8 bits has a corresponding bit, that is, 1 Byte=8 bit. Based thereon, in the embodiment, N is 8 to maximize the bits in each byte, thus facilitating improvement of the utilization of the circuit required for encoding and decoding in the storage system. It is to be understood that in another embodiment, N may also be another suitable positive integer.

Taking the data transmitted by the memory 101 during a single read-write operation as 128 bits (i.e. 128 bits) as an example, M is 16 and N is 8. It is to be noted that in another embodiment, according to the difference of data bits transmitted by the memory during the read-write operation, M may also be another suitable positive integer, so long as M*N is equal to the data bits transmitted during the read-write operation.

Figure 2:
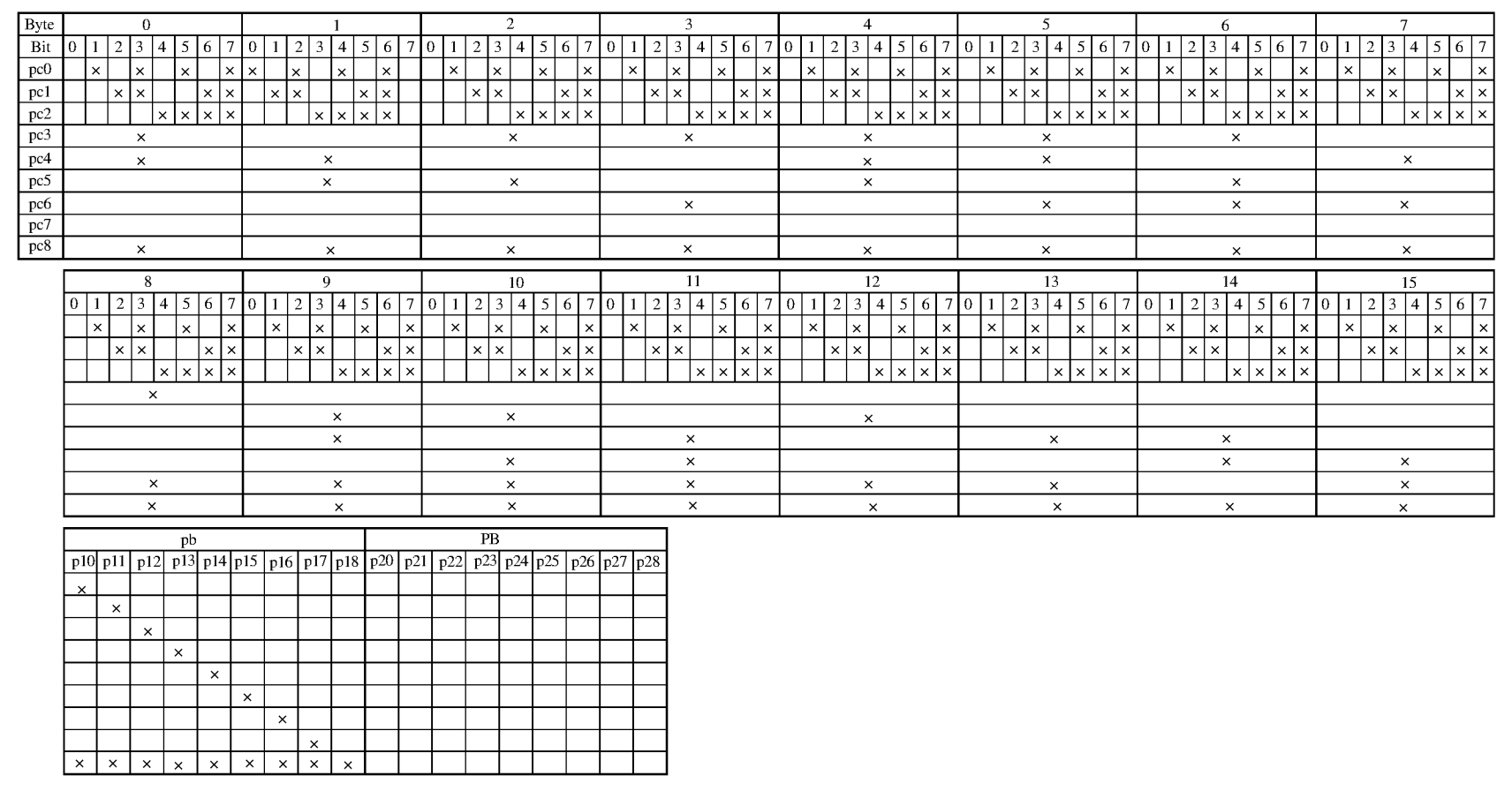

FIG. 2 is a classification diagram of a plurality of pieces of data and a relation among a first check code, a second check code and a third check code according to an embodiment of the present disclosure. The bits of each of the N pieces of data are different. Specifically, as shown in FIG. 2, for each byte, N pieces of data have bits incremented from the 0th to the 7th in accordance with natural numbers. For all bytes, M bytes are divided into 16 bytes incremented from the 0th to the 15th in accordance with the natural number. In addition, for different bytes, the N pieces of data in the bytes all have 8 bits incremented from the 0th to the 7th.

It is to be noted that, due to the limitation of location, the tables in FIG. 2, which should actually be in the same row, are split into three tables, which are actually a complete table. For the sake of illustration, FIG. 3 shows an enlarged schematic diagram of the first check code corresponding to byte 0.

In the embodiment, the encoding circuit 102 uses a Parity Check principle to generate the first check code and the second check code. Accordingly, the first check code and the second check code are both parity check codes. In the embodiment, the storage system is a memory chip, and the corresponding memory 101 and encoding circuit 102 are integrated in the same memory chip. It is to be understood that in another embodiment, the memory may be a memory chip, the storage system may also include a controller configured to control the memory, and the encoding circuit is also integrated in the controller. It is to be noted that the embodiment of the present disclosure does not limit that the memory and the encoding circuit are integrated on the same chip or configured on different chips.

Figures 3, 4:
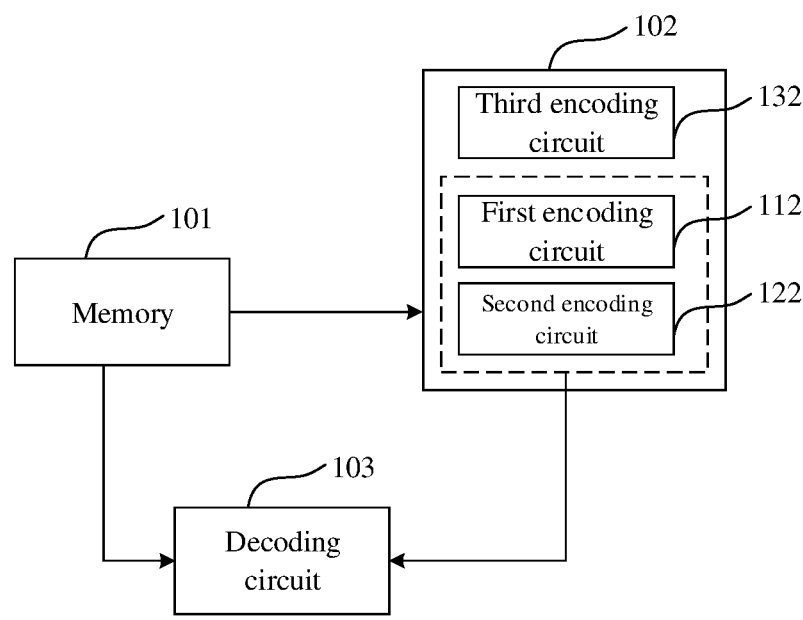
FIG. 3 illustrates an enlarged diagram of a first check code corresponding to byte 0.
FIG. 4 is another functional block diagram of a memory according to an embodiment of the present disclosure.

FIG. 4 is another functional block diagram of a memory according to an embodiment of the present disclosure.

Referring to FIG. 4, the encoding circuit 102 may include: a first encoding circuit 112 configured to generate X first check codes, and the X first check codes constitute X bits of first binary numbers, where $2^x \geq N$. Each first check code is obtained by performing a first encoding operation on the two or more pieces of data of the data in all bytes, and the two or more pieces of data corresponding to each first check code correspond to different bit combinations in the respective bytes. That is, each first check code is obtained by selecting the data of a plurality of bits in each byte for the first encoding operation, and for the same first check code, the selected bit combinations in all bytes are the same, and for different first check codes, the selected bit combinations in N pieces of data are different.

The N pieces of data have 0th to (N−1)th bits incremented in accordance with natural numbers, and the first check codes obtained by selecting each of the bits to execute the first encoding operation are not exactly the same. Specifically, different first check codes are obtained by performing the first encoding operation based on different data in all bytes, so that the bits influencing the results of the first check codes are different for different first check codes. Meanwhile, due to the fact that $2^x \geq N$, the first check codes obtained by selecting each of the bits to execute the first encoding operation may not be exactly the same, so that through analysis, corresponding to which bit the data has an error may be obtained.

In the embodiment, X is 3, which can not only satisfy that the errors of different bits of data can be indicated, but also reduce the complexity of the hardware circuit of the first encoding circuit 112.

In a specific example, the 3 first check codes, in a sequence from a low bit to a high bit in accordance with the bits, include a 0th-bit first check code, a 1st-bit first check code and a 2nd-bit first check code. N pieces of data have 0th to (N−1)th bits incremented in accordance with natural numbers. For example, for a 0th bit, it does not participate in the first encoding operation corresponding to any first check code. For a 1st bit, it participates in the first encoding operation corresponding to the 0th-bit first check code. For a 2nd bit, it participates in the first encoding operation corresponding to the 1st-bit first check code. For a 3rd bit, it participates in the first encoding operation corresponding to the 0th-bit first check code and the 1st-bit first check code. For a 4th bit, it participates in the first encoding operation corresponding to the 2nd-bit first check code. For a 5th bit, it participates in the first encoding operation corresponding to the 0th-bit first check code and the 2nd-bit first check code. For a 6th bit, it participates in the first encoding operation corresponding to the 1st-bit first check code and the 2nd-bit first check code. For a 7th bit, it participates in the first encoding operation corresponding to the 0th-bit first check code, the 1st-bit first check code and the 2nd-bit first check code. It is to be understood that those skilled in the art may set the number of the first check codes and other encoding operation relations as needed, as long as the first check codes obtained by selecting each of the bits to execute the first encoding operations are not exactly the same.

In the embodiment, the first encoding operation is XOR. Accordingly, the first encoding circuit 112 is configured such that in the X bits of first binary numbers, the first check code at the lowest bit is the XOR of the data of the 1st, 3rd, 5th and 7th bits in all bytes, the first check code at the highest bit is the XOR of the data of the 4th, 5th, 6th and 7th bits in all bytes, and the first check code at the middle bit is the XOR of the data of the 2nd, 3rd, 6th and 7th bits in all bytes.

It is to be noted that in another embodiment, the first encoding operation may also be XNOR. Accordingly, the first encoding circuit is configured such that in the X bits of first binary numbers, the first check code at the lowest bit is the XNOR of the data of the 1st, 3rd, 5th and 7th bits in all bytes, the first check code at the highest bit is the XNOR of the data of the 4th, 5th, 6th and 7th bits in all bytes, and the first check code at the middle bit is the XNOR of the data of the 2nd, 3rd, 6th and 7th bits in all bytes.

The generation principle of the first check codes will be explained with reference to FIG. 2 and FIG. 3.

As shown in FIG. 2 and FIG. 3, "X" indicates that it is currently participating in the encoding operation of this row, that is, executing XNOR or XOR. The 128 bits of data are divided into 16 bytes from 0th to 15th, and each byte has 8 bits. p10, p11 and p12 represent 3 first check codes. p13, p14, p15, p16 and p17 represent 5 second check codes. pc0 to pc7 represent 8 expressions correspondingly employed by p10 to p17 when the encoding operation is executed. In each row, all locations of a tag "X" indicate that the data corresponding to this column needs to participate in XOR or XNOR in this expression. The first check codes and the second check codes correspond to pb.

During the first encoding operation or the second encoding operation in the encoding stage, the first encoding operation or the second encoding operation is performed by using the eight expressions of pc0 to pc7, and the operation results are stored in p10 to p17 respectively. p10 to p17 do not participate in the first encoding operation or the second encoding operation. In the decoding stage, the expression corresponding to each row remains unchanged, and the stored p10 to p17 need to participate in the operation. Therefore, p10 to p17 are correspondingly marked with "X" in the table of FIG. 2. This will be described in detail later.

Specifically, in the encoding stage, for each byte, the data of the 1st, 3rd, 5th and 7th bits in this byte are subjected to XOR or XNOR, then all XOR results or XNOR results of the 16 bytes are subjected to XOR or XNOR, which is a pc0 expression, and the operation result is given to p10. For each byte, the data of the 2nd, 3rd, 6th and 7th bits in this byte are subjected to XOR or XNOR, then all XOR results or XNOR results of the 16 bytes are subjected to XOR or XNOR, which is a pc1 expression, and the operation result is given to p11. For each byte, the data of the 4th, 5th, 6th and 7th bits in this byte are subjected to XOR or XNOR, then all XOR results or XNOR results of the 16 bytes are subjected to XOR or XNOR, which is a pc2 expression, and the operation result is given to p12.

p10, p11 and p12 constitute the first binary numbers. p10 is the lowest bit and p12 is the highest bit. On the premise that only one bit of data in the plurality of pieces of data of the memory has an error, it is not difficult to find the following situations.

If the data of the 0th bit has an error, due to the fact that the 0th bit does not participate in these three expressions of pc0, pc1 and pc2, none of the first check codes p10, p11 and p12 are influenced.

If the data of the 1st bit has an error, due to the fact that the 1st bit participates in the expression of pc0 but does not participate in these two expressions of pc1 and pc2, the first check code p10 is influenced but the first check codes p11 and p12 are not influenced.

If the data of the 2nd bit has an error, due to the fact that the 2nd bit participates in the expression of pc1, the first check codes p10 and p12 are not influenced but the first check code p11 is influenced.

If the data of the 3rd bit has an error, due to the fact that the 3rd bit participates in these two expressions of pc0 and pc1, the first check codes p10 and p11 are both influenced but the first check code p12 is not influenced.

Similarly, if the data of the 7th bit has an error, due to the fact that the 7th bit participates in these three expressions of pc0, pc1 and pc2, the first check codes p10, p11 and p12 are influenced.

It is to be noted that that a specific first check code is influenced after a specific data has an error here indicates that after the specific data has an error, the specific first check code obtained by re-performing the first encoding operation may be different from the first check code formed before the data has an error.

It is to be understood that for each expression, due to the fact that the bits participating in the first encoding operation in different bytes are the same, of which bit the data has an error may be obtained through the first check codes, but in which byte the data of the corresponding bit has an error may not be detected. Therefore, the second check codes are required for obtaining in which byte the data of the corresponding bit has an error.

Correspondingly, in the embodiment, the encoding circuit 102 may further include: a second encoding circuit 122 configured to generate Y second check codes, and the Y second check codes constitute Y bits of second binary numbers, where $2^Y \geq M$. Each second check code is obtained by performing a second encoding operation on two or more of bytes. $2^Y \geq M$ to ensure that the second check codes obtained by each of the bytes participating in the second encoding operation are not exactly the same. Specifically, different second check codes are obtained by performing the second encoding operation based on different bytes, so that the bytes influencing the results of the second check codes are different for different second check codes, thus facilitating comprehensive analysis to obtain in which byte the data has an error. Then, which bit in the byte has an error is combined to finally determine which bit of data in which byte has an error. It is to be noted that the meaning of "influence" in the result of influencing the second check codes mentioned here is the same as the meaning of "influence" mentioned above.

In the embodiment, Y is 5, which can not only satisfy that the errors of different bits of data can be indicated, but also reduce the complexity of the hardware circuit of the second encoding circuit 122.

Specifically, in the embodiment, the second encoding operation is XOR. The second encoding circuit 122 may include: a first-level operation circuit configured to execute XOR on all data of two selected bytes and store a plurality of first operation results, each first operation result being the XOR result of the two selected bytes; and a second-level operation circuit configured to execute XOR on at least two first operation results, generate second check codes, and generate Y second check codes based on different encoding requirements.

In another embodiment, the second encoding operation may be XNOR. Correspondingly, the second encoding circuit may include: a first-level operation circuit configured to execute XNOR on all data of two selected bytes and store a plurality of first operation results, each first operation result being the XNOR result of the two selected bytes; and a second-level operation circuit configured to execute XNOR on at least two first operation results, generate second check codes, and generate Y second check codes based on different encoding requirements.

In the embodiment, through the special design of the second encoding circuit 122, the second-stage operation circuit may reuse the first operation result of the first-level operation circuit, so that the second encoding circuit 122 may be implemented through fewer hardware circuits, to reduce the power consumption of the storage system.

Correspondingly, the first-level operation circuit may include: a first operation subunit configured to execute XOR or XNOR on all data of the same byte and store second operation results; and a second operation subunit configured to execute XOR or XNOR on two second operation results and obtain a first operation result.

Figures 5, 6:
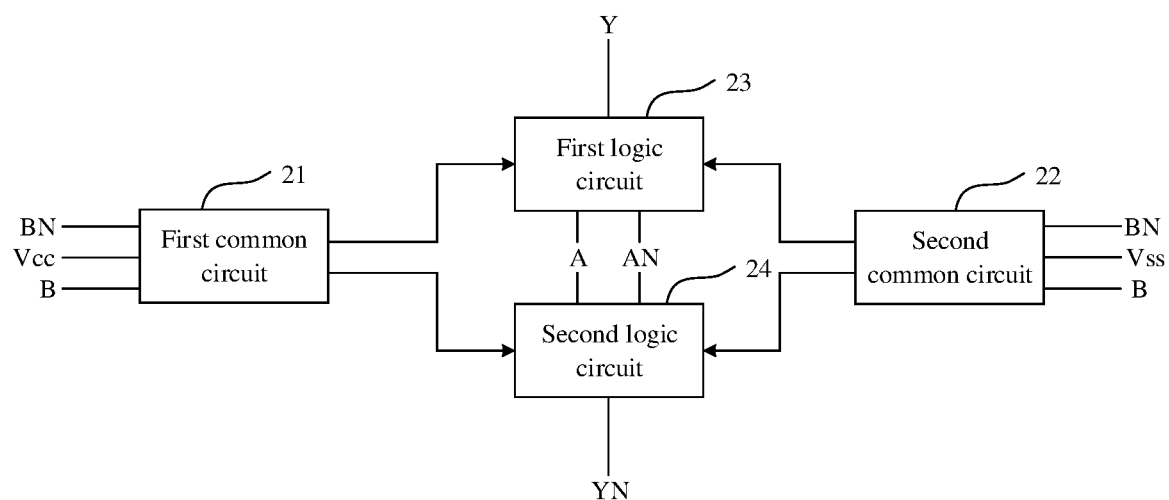
FIG. 5 illustrates a schematic diagram of performing a second encoding operation on all bytes.
FIG. 6 is a functional block diagram of a comparison circuit in a storage system according to an embodiment of the present disclosure.

Specifically, as shown in FIG. 5, in the encoding stage, for each byte, the data of all the 8 bits in the byte are subjected to XOR to obtain an XOR result of the byte. Then, the 16 XOR results of a total of 16 bytes are subjected to the second encoding operation according to the five expressions of pc3 to pc7, that is, all data with the tag "X" in the table of each row participate in the operation, and the second check codes pc13 to pc17 are obtained accordingly. It is to be understood that in the encoding stage, the second check codes pc13 to pc17 do not participate in the encoding operation, and the second check codes pc13 to pc17 also need to participate in the operation in the subsequent decoding stage (or called a deciphering stage). Therefore, in FIG. 2, the second check codes pc13 to pc17 are also marked with "X", which will be explained later and will not be repeated here.

In the embodiment, the M bytes are divided into the 0th to 15th bytes incremented in accordance with natural numbers. The Y second check codes are divided into the 3rd to 7th second check codes incremented in accordance with natural numbers. The acquisition methods of the five second check codes are as follows.

The 3rd second check code (corresponding to p13 in FIG. 2) is the XOR or XNOR of all data of the 0th, 2nd, 3rd, 4th, 5th, 6th and 8th bytes. The 4th second check code (corresponding to p14 in FIG. 2) is the XOR or XNOR of all data of the 0th, 1st, 4th, 5th, 7th, 9th, 10th and 12th bytes. The 5th second check code (corresponding to p15 in FIG. 2) is the XOR or XNOR of all data of the 1st, 2nd, 4th, 6th, 9th, 11th, 13th and 14th bytes. The 6th second check code (corresponding to p16 in FIG. 2) is the XOR or XNOR of all data of the 3rd, 5th, 6th, 7th, 10th, 11th, 14th and 15th bytes. The 7th second check code (corresponding to p17 in FIG. 2) is the XOR or XNOR of all data of the 8th, 9th, 10th, 11th, 12th, 13th and 15th bytes.

It is to be noted that each second check code is obtained by an XOR operation. Alternatively, each second check code is obtained by an XNOR operation.

Referring to FIGS. 2, 4 and 5, the circuit corresponding to the second encoding circuit 122 is designed as follows.

The XOR results of byte 0 and byte 4 are subjected to XOR to obtain a result 0_4. The results of byte 2 and byte 6 are subjected to XOR to obtain a result 2_6. The results of byte 3 and byte 5 are subjected to XOR to obtain a result 3_5. The results of byte 1 and byte 5 are subjected to XOR to obtain a result 1_5. The results of byte 1 and byte 4 are subjected to XOR to obtain a result 1_4.

It is not difficult to find that, as shown in FIG. 5, FIG. 5 illustrates a schematic diagram of performing a second encoding operation on all bytes. Compared with bytes 0 to 7, the same set of circuits may be used to complete the operation on byte 8 to byte 15, that is, just changing the input, the same operation may be performed on the byte 8 to the byte 15 to obtain a result 9_13, a result 10_12, a result 11_15, a result 10_14, and a result 11_14. Moreover, in addition to these operations that may use the same circuit, it is also necessary to execute XOR on byte 6 and byte 7 to obtain a result 6_7 and execute XOR on the results of byte 7 and byte 9 to obtain a result 7_9.

XOR is executed according to the requirements of the expressions of pc3 to pc7: for example, according to the expression pc3, the result 0_4, the result 2_6, the result 3_5 and the XOR result of the byte 8 are subjected to XOR to obtain a second check code p13. According to the expression pc4, the result 0_4, the result 1_5, the result 7_9 and the result 10_12 are subjected to XOR to obtain a second check code p14. The acquisition methods of the second check codes p15, p16 and p17 will not be described in detail. It is to be understood that the result 0_4, the result 2_6, etc. may be reused to save circuit resources.

Moreover, in the embodiment, the second encoding circuit 122 may also be configured such that a number of times that each byte participates in the second encoding operation is $\alpha$. $\alpha$ satisfies: $(Y-1)/2 \alpha (Y+1)/2$, and $\alpha$ is a positive integer. With such arrangement, in the decoding circuit required for the subsequent decoding stage, the circuit line and area can be reduced, which also facilitates the improvement of the decoding speed.

Referring to FIG. 4, the encoding circuit 102 may further include: a third encoding circuit 132. The third encoding circuit 132 is connected with an output end of the first encoding circuit 112 and an output end of the second encoding circuit 122 and also receives a plurality of pieces of data for generating a third check code. The third check code is obtained by executing a fifth encoding operation on the plurality of pieces of data, the X first check codes and Y second check codes.

In the embodiment, the fifth encoding operation is XOR. Correspondingly, the third encoding circuit 132 is configured to execute an XOR operation on the plurality of pieces of data, the X first check codes and the Y second check codes to generate the third check code. During the write-read operation, the storage system not only stores the plurality of pieces of data, the X first check codes and the Y second check codes but also stores the third check code.

Subsequently, the first check codes, the second check codes and third check code are jointly used to determine the bit number of erroneous data. Specifically, during subsequent data reading, a third operation code will be generated based on the plurality of pieces of data, the first check codes, the second check codes and the third check code. Since all data, the first check codes, the second check codes and the third check code participate in the operation of generating the third operation code, if the third operation code is 0, it represents that there is no error or a 2-bit error (assuming that there is only the 2-bit error at most), but it is difficult to determine whether the data has an error only according to the third operation code. If the third operation code is 1, it represents that there is a 1-bit error, but it is difficult to determine whether the data has an error or the first check codes, the second check codes or the third check code has an error only according to the third operation code. It is to be understood that in another embodiment, if 0 indicates having an error and 1 indicates having no error, the third operation code is 1, which indicates having no error or a 2-bit error. If the third operation code is 0, it indicates a 1-bit error.

The generation principle of the third check codes will be explained with reference to FIG. 2.

As shown in FIG. 2, p18 represents the third check code and pc8 represents the expression used when executing the fifth encoding operation. Specifically, the first encoding operation and the second encoding operation are first executed to generate the first check codes p10-p12 and the second check codes p13-p17, and then all data, the first check codes p10-p12 and the second check codes p13-p17 are subjected to the fifth encoding operation to obtain the third check code.

More specifically, in the encoding stage, all data in each byte are subjected to XOR or XNOR, then the XOR result or the XNOR result with the first check codes p10-p12 and the second check codes p13-p17 is subjected to XOR or XNOR, namely the pc8 expression. The operation result is given to p18 to generate the third check code.

It can be seen from the above description that XOR or XNOR is used for the acquisition of the first check codes, the second check codes or the third check code. Therefore, the storage system may also include a comparison circuit for implementing XNOR or XOR.

FIG. 6 is a functional block diagram of a comparison circuit in a storage system according to an embodiment of the present disclosure. In the embodiment, the encoding circuit 102 may further include: a comparison circuit configured to execute XOR or XNOR on all data of any two bytes or execute XOR or XNOR on two or more pieces of data.

Referring to FIG. 6, the comparison circuit may include: a first common circuit 21, which is connected to a power signal Vcc and controls outputting of the power signal Vcc based on a first signal B and a second signal BN, the first signal B being inverted with respect to the second signal BN; a second common circuit 22, which is connected to a grounding signal Vss and controls outputting of the grounding signal Vss based on the first signal B and the second signal BN; a first logic circuit 23, which is connected between the first common circuit 21 and the second common circuit 22 for receiving a third signal A and a fourth signal AN, the third signal A being inverted with respect to the fourth signal AN, and outputting a first operation signal Y, which is the XOR of the first signal B and the third signal A; and a second logic circuit 24, which is connected between the first common circuit 21 and the second common circuit 22 for receiving the third signal A and the fourth signal AN and outputting a second operation signal YN, which is the XNOR of the first signal B and the third signal A.

Figure 7:
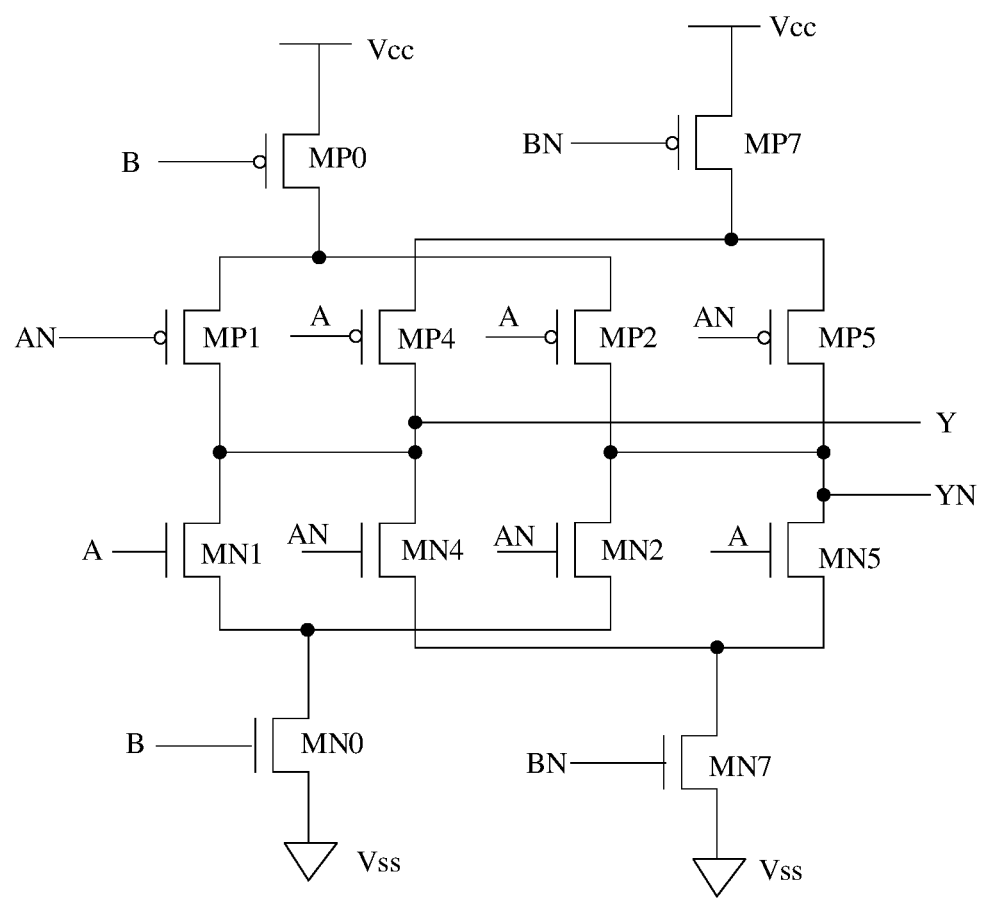
FIG. 7 is a circuit structure diagram of a comparison circuit.

FIG. 7 is a circuit structure diagram of a comparison circuit.

Specifically, referring to FIG. 7, the first common circuit 21 may include: a zeroth PMOS transistor MP0, whose gate receives the first signal B and whose source is connected to the power signal Vcc; and a seventh PMOS transistor MP7, whose gate receives the second signal BN and whose source is connected to the power signal Vcc. When the first signal B is at a high level and the second signal BN is at a low level, the zeroth PMOS transistor MP0 is turned off and the seventh PMOS transistor MP7 is turned on. When the first signal B is at a low level and the second signal BN is at a high level, the zeroth PMOS transistor MP0 is turned on and the seventh PMOS transistor MP7 is turned off.

The second common circuit 22 may include: a zeroth NMOS transistor MN0, whose gate receives the first signal B and whose source is connected to the grounding signal Vss; and a seventh NMOS transistor MN7, whose gate receives the second signal BN and whose source is connected to the grounding signal Vss. When the first signal B is at a high level and the second signal BN is at a low level, the zeroth NMOS transistor MN0 is turned on and the seventh NMOS transistor MN7 is turned off. When the first signal B is at a low level and the second signal BN is at a high level, the zeroth NMOS transistor MN0 is turned off and the seventh NMOS transistor MN7 is turned on.

In the embodiment, the first logic circuit 23 may include: a first PMOS transistor MP1, whose gate receives a fourth signal AN and whose source is connected to a drain of the zeroth PMOS transistor MP0; a first NMOS transistor MN1, whose gate receives the third signal A, whose drain is connected to a drain of the first PMOS transistor MP1, and whose source is connected to a drain of the zeroth NMOS transistor MN0; a fourth PMOS transistor MP4, whose gate receives the third signal A and whose source is connected to a drain of the seventh PMOS transistor MP7; and a fourth NMOS transistor MN4, whose gate receives the fourth signal AN, whose drain is connected to a drain of the fourth PMOS transistor MP4, and whose source is connected to a drain of the seventh NMOS transistor MN7.

The second logic circuit 24 may include: a second PMOS transistor MP2, whose gate receives the third signal A and whose source is connected to a drain of the zeroth PMOS transistor MP0; a second NMOS transistor MN2, whose gate receives the fourth signal AN, whose drain is connected to a drain of the second PMOS transistor MP2, and whose source is connected to a drain of the zeroth NMOS transistor MN0; a fifth PMOS transistor MP5, whose gate receives the fourth signal AN and whose source is connected to a drain of the seventh PMOS transistor MP7; and a fifth NMOS transistor MN5, whose gate receives the third signal A, whose drain is connected to a drain of the fifth PMOS transistor MP5, and whose source is connected to a drain of the seventh NMOS transistor MN7.

In addition, the drain of the first PMOS transistor MP1 is connected to the drain of the fourth PMOS transistor MP4 to output a first operation signal Y; and the drain of the second PMOS transistor MP2 is connected with the drain of the fifth PMOS transistor MP5 to output a second operation signal YN.

In the comparison circuit provided by the embodiment, the XOR logic and the XNOR logic share four MOS transistors. The area may be saved by sharing the MOS transistors, and the sizes of the shared MOS transistors may be enlarged, thus improving the drive capability.

With reference to FIG. 1 and FIG. 2, in the embodiment, the encoding circuit 102 is further configured to receive a plurality of pieces of transmitted data, X first check codes and Y second check codes in the decoding stage, execute a third encoding operation based on the two or more pieces of data in each byte and the X first check codes to generate X first operation codes, and execute a fourth encoding operation based on all data of two or more bytes of the M bytes and the Y second check codes to generate Y second operation codes.

Specifically, the bits of the data participating in the operation in the third encoding operation are the same as those in the first encoding operation, but the difference is that the first check codes also participate in the operation in the third encoding operation. The bytes participating in the operation in the fourth encoding operation are the same as those in the second encoding operation, but the difference is that the second check codes also participate in the operation in the fourth encoding operation.

It is to be noted that the encoding operation function of the encoding stage and the encoding operation function of the decoding stage may be integrated to the same function circuit for implementation. In another example, the encoding operation functions of the encoding stage and the decoding stage may be implemented by using different function circuits.

Generally, the decoding stage occurs in the process of reading data during the reading operation. More specifically, referring to FIG. 2 and the foregoing description of the generation principle of the first check codes and the second check codes, in the encoding operation in the decoding stage, it is necessary to execute XOR again on the first check code p10, p11 or p12 on the basis of the encoding operation in the encoding stage, to obtain the first operation code p20, p21 or p22 accordingly. That is, for the first operation code p20, the received data of different bits in each byte and the first check code p10 are subjected to the third encoding operation by using the pc0 expression to obtain the first operation code p20. The received data of different bits in each byte and the first check code p11 are subjected to the third encoding operation by using the pc1 expression to obtain the first operation code p21. The received data of different bits in each byte and the first check code p12 are subjected to the third encoding operation by using the pc2 expression to obtain the first operation code p22. The first operation codes and the second operation codes correspond to PB in FIG. 2.

Similarly, for the second check codes and the second operation codes, in the encoding operation in the decoding stage, it is necessary to execute XOR again on the second check code p13, p14, p15, p16 or p17 on the basis of the encoding operation in the decoding stage, to obtain the second operation code p23, p24, p25, p26 or p27 correspondingly.

p20, p21 and p22 constitute third binary numbers. p20 is the lowest bit and p22 is the highest bit. On the premise that only one bit of data in the plurality of pieces of data of the memory has an error, it is not difficult to find the following situations if the third encoding operation is XOR (may also be XNOR in another embodiment).

If the data of the 0th bit has an error, due to the fact that the 0th bit does not participate in these three expressions of pc0, pc3 and pc3, the first operation codes p20, p21 and p22 all are 0, and a decimal number corresponding to the third binary number 000 is 0 to detect that the data of the 0th bit has an error.

If the data of the 1st bit has an error, due to the fact that the 1st bit participates in the expression of pc0 but does not participate in these two expressions of pc1 and pc2, the first operation code p20 is 1, the first operation codes p21 and p22 are 0, and the decimal number corresponding to the third binary number 001 is 1 to detect that the data of the 1st bit has an error.

If the data of the 2nd bit has an error, due to the fact that the 2nd bit participates in the expression of pc1, the first operation code p20 is 0, the first operation codes p21 and p12 are 1 and 0 correspondingly, and the decimal number corresponding to the third binary number 010 is 2 to detect that the data of the 2nd bit has an error.

If the data of the 3rd bit has an error, due to the fact that the 3rd bit does not participate in these two expressions of pc0 and pc1, the first operation codes p20 and p21 both are 0, p12 is 0, and the decimal number corresponding to the third binary number 011 is 3 to detect that the data of the 3rd bit has an error.

Similarly, if the data of the 7th bit has an error, due to the fact that the 7th bit participates in these three expressions of pc0, pc1 and pc2, the first operation codes p20, p21 and p22 are all 1, and the decimal number corresponding to the third binary number 111 is 7 to detect that the data of the 7th bit has an error.

In the embodiment, the encoding circuit 102 is further configured to receive a plurality of pieces of transmitted data, X first check codes, Y second check codes and the third check code in the decoding stage, and execute a sixth encoding operation based on the plurality of pieces of data, the X first check codes, the Y second check codes and the third check code to generate the third operation code.

Referring to FIG. 2 and the foregoing description of the generation principle of the third check code, in the encoding operation in the decoding stage, it is necessary to execute XOR again on the third check code on the basis of the encoding operation in the encoding stage. Specifically, all the received data, the X first check codes, the Y second check codes and the third check code p18 are subjected to a sixth encoding operation by using the expression pc8 to obtain the third operation code p28.

It can be determined that a bit where the data having an error locates is bit 0, bit 1 or bit 2 in combination with the first operation codes, the second operation codes and the third operation code.

Correspondingly, in the embodiment, the storage system may also include: a decoding circuit 103 configured to receive the X first operation codes, the Y second operation codes and the third operation code and locate data having an error. Specifically, the first operation codes, the second operation codes and the third operation code are used for identifying the current error state to determine the error states of a plurality of pieces of data. The X first operation codes are used for locating a bit where the data having an error locates. The Y second operation codes are used for locating the byte having an error. Specifically, the current error state may include: a 0-bit error, a 1-bit error, and a 2-bit error.

For the specific principle and descriptions related to the first operation codes and the second operation codes used for locating the data having an error, the relevant descriptions of the first check codes and the second check codes may be referred to, which will not be repeated here. It is to be noted that the decoding circuit 103 may be integrated with the memory 101 in the same memory chip. Or, the storage system may further include a controller for controlling the memory, and the decoding circuit is integrated in the controller. In addition, it is further to be noted that the decoding circuit 103 and the encoding circuit 102 may also be integrated in the same function circuit.

Figure 8:
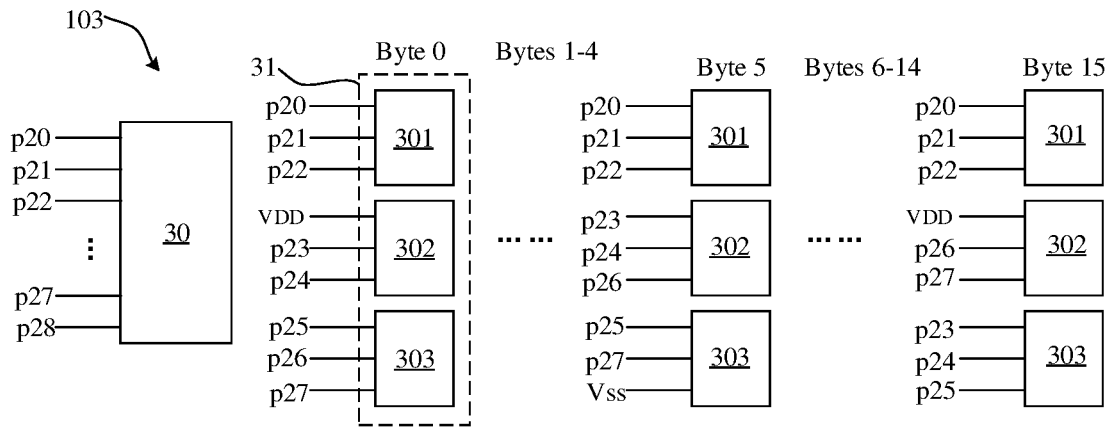
FIG. 8 is a specific structure diagram of a decoding circuit in a storage system according to an embodiment of the present disclosure.

FIG. 8 is a specific structure diagram of a decoding circuit in a storage system according to an embodiment of the present disclosure. Referring to FIG. 8, the decoding circuit 103 may include: an error state determination circuit 30 configured to execute decoding processing on the X first operation codes, the Y second operation codes and the third operation code to identify the current error state; and M decoding circuits 31, each corresponding to a byte, configured to execute decoding processing on the X first operation codes and the Y second operation codes to obtain whether there is the data having an error in the byte and locate a bit where the data having an error locates. In FIG. 8, the first operation codes are marked with p20, p21 and p22, the second operation codes are marked with p23, p24, p25, p26 and p27, and the third operation code is marked with p28. Specifically, each decoding circuit 31 executes decoding processing on the X first operation codes and the Y second operation codes corresponding to the byte. That is, the number of the decoding circuits 31 is the same as that of the bytes.

The error state determination circuit 30 is configured to determine the bit having an error in the first check codes, the second check codes, the third check code and the data. The error state includes the 0-bit error, the 1-bit error and the 2-bit error. Specifically, taking the third encoding operation, the fourth encoding operation and the sixth encoding operation all being the XOR operation as an example, the judgment principle is as follows.

If the third operation code is 1, and the first operation codes and the second operation codes are not all 0, it represents that the data having an error is bit 1, which may appear in the data and may also appear in the first check codes or the second check codes. At the moment, error detection and/or error correction may be executed through the decoding circuit 31. The principle of detecting the location of the erroneous data will be described in detail later, and will not be described here.

If the third operation code is 1, and both the first operation codes and the second operation codes are 0, it indicates that the data read by the storage system does not have an error, and the third check code has an error, which may be corrected or not corrected. Those skilled in the art may choose by themselves as needed.

If the third operation code is 0, and the first operation codes and the second operation codes are not all 0, it indicates that the read data does not have an error, and none of the first check codes, the second check codes and the third check code have an error.

If the third operation code is 0, and the first operation codes and the second operation codes are not all 0, it indicates that the bit number having an error is bit 2. At the moment, correction cannot be executed, and those skilled in the art may design to send the erroneous information to a control device as needed.

It is to be noted that the premise described above is to assume that there is only the 2-bit error at most.

The error state determination circuit 30 is connected with M decoding circuits 31. If a 1-bit error exists (namely the situation that the third operation code is 1, and the first operation codes and the second operation codes are not all 0), the data having an error may be located by using the M decoding circuits 31.

Figure 9:
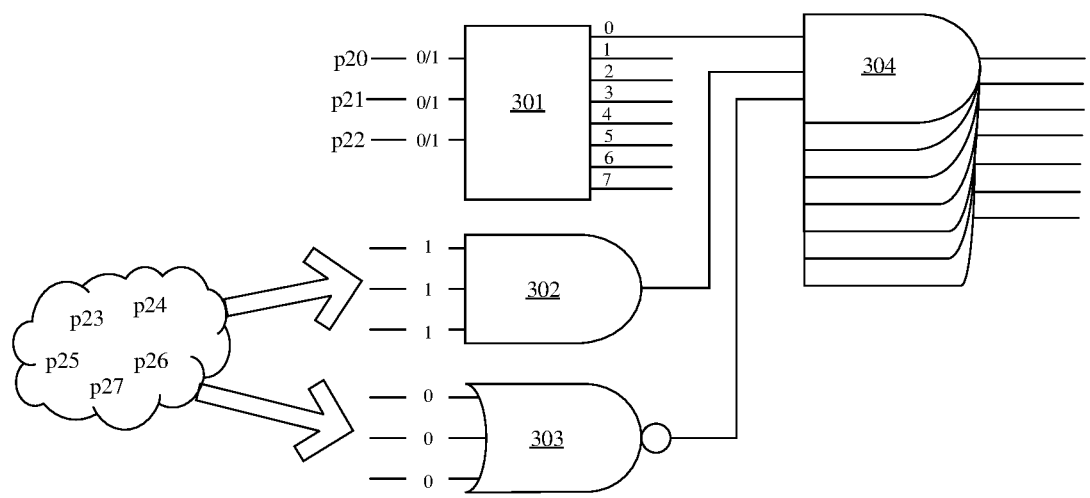
FIG. 9 is an enlarged structure diagram of a decoding circuit corresponding to a byte 5 in a decoding circuit according to an embodiment of the present disclosure.

FIG. 9 is an enlarged structure diagram of a decoding circuit 31 corresponding to a byte 5 in a decoding circuit according to an embodiment of the present disclosure.

Referring to FIG. 9, in the embodiment, the decoding circuit 31 may include: a decoder 301, configured to receive the X first operation codes and output N first decoding signals, each first decoding signal corresponding to a bit of N pieces of data; a first AND gate circuit 302, configured to receive at least two selected operation codes and execute a logic AND operation, the selected operation codes being the second operation codes obtained by executing the fourth encoding operation on the second check codes corresponding to the corresponding bytes in the Y second check codes; a NOR gate circuit 303, configured to receive at least two unselected operation codes and execute a logic NOR operation, the unselected operation codes being the second operation codes except the selected operation codes in the Y second operation codes; and N second AND gate circuits 304, an input end of each second AND gate circuit 304 being connected with an output end of the first AND gate circuit 302, an output end of the NOR gate circuit 303 and a first decoding signal, and the location of the data having an error being obtained based on the output of the N second AND gate circuits 304. It is to be noted that the second check codes corresponding to the corresponding bytes here mean the second check codes formed by the bytes selected to participate in the second encoding operation. For example, as may be seen from FIG. 2, the second check codes corresponding to the 0th byte are p13 and p14.

It is to be noted that FIG. 9 only illustrates the connection relationship between a first decoding signal and a second AND gate circuit 304.

In the embodiment, the decoder 301 is a three-eight decoder. Three input ends receive three first operation codes and eight output ends output eight first decoding signals, and each first decoding signal represents the situations of 8 bits of data in the same byte.

Specifically, the first operation codes p20, p21 and p22 are 0 or 1, and the output ends are marked with 0 to 7. If the 0th bit has an error and the 0th bit does not participate in the encoding operation of the first operation codes, p20, p21 and p22 are all 0, and the corresponding "0" output end is 1 and the other output ends are all 0. If the 1st bit has an error, p20 is 1 and p21 and p22 are 0, the corresponding "1" output end is 1 and the other output ends are 0. By analogy, if the 7th bit has an error, p20, p21 and p22 are all 1, and the corresponding "7" output end is 1 and the other output ends are 0.

It is to be noted that in another embodiment, the number of input ends and the number of output ends of the decoder may also be reasonably set according to the difference between the first check codes and the number of bits in each byte.

The first AND gate circuit 302 has the characteristics that if all the input ends are 1, the output ends are 1, and if there is one or more 0s in the input ends, the output ends are 0. In the embodiment, the first AND gate circuit 302 has three input ends. The first AND gate circuit 302 is also configured such that the input end of the first AND gate circuit 302 is connected with a power source VDD if the number of the selected operation codes is 2.

The NOR gate circuit 303 has the characteristics that if all the input ends are 0, the outputs are 1, and if there is one or more 1s in the input ends, the output ends are 0. In the embodiment, the NOR gate circuit has three input ends. The NOR gate circuit 303 is also configured such that an input end of the NOR gate circuit 303 is grounded Vss if the number of the unselected operation codes is 2.

Specifically, the selected operation code corresponds to the second operation code obtained by executing the fourth encoding operation on the corresponding second check code for this byte. The unselected operation code corresponds to the second operation code obtained by executing the fourth encoding operation on the other second check codes except the corresponding second check code for this byte.

For example, for the byte 0, the second operation codes p23 and p24 are the second operation codes obtained by executing the fourth encoding operation on the second check codes p13 and p14 corresponding to the byte 0, then the second operation codes p23 and p24 are input to the input end of the first AND gate circuit 302, and the other second operation codes p25, p26 and p27 are input to the input end of the NOR gate circuit 303. For the byte 1, the second operation codes p24 and p25 are the second operation codes obtained by executing the fourth encoding operation on the second check codes p14 and p15 corresponding to the byte 1, then the second operation codes p24 and p25 are input to the input end of the first AND gate circuit 302, and the other second operation codes p23, p26 and p27 are input to the input end of the NOR gate circuit 303. For the byte 4, the second operation codes p23, p24 and p25 are input to the input end of the first AND gate circuit 302, and the other second operation codes p26 and p27 are input to the input ends of the NOR gate circuit 303. The other bytes will not be listed one by one.

The number of the second AND gate circuits 304 is the same as that of bits in the same byte. In the embodiment, N is 8 and there are 8 second AND gate circuits 304, correspondingly. According to the outputs of the 8 second AND gate circuits 304, it is determined whether there is the data having an error in the byte and which bit has an error.

It is not difficult to find that in this embodiment, the circuits of the decoding circuits 31 are the same for each byte, but the wiring of the input ends is different; and the wiring of the input ends of the first AND gate circuit 302 and the NOR gate circuit 303 corresponding to each byte is determined by the five expressions of pc3 to pc7 in FIG. 2. For each byte, the second operation codes obtained by executing the fourth encoding operation on the corresponding second check codes are connected to the input end of the first AND gate circuit 302, and the second operation codes obtained by executing the fourth encoding operation on the other second check codes except the corresponding second check codes are connected to the input end of the NOR gate circuit 303. In addition, the input end of the unused first AND gate circuit 302 is connected to the power supply VDD, and the input end of the unused NOR gate circuit 303 is grounded Vss; and the first operation codes are connected to the input end of the decoder 301. Therefore, the decoding circuit 301 only uses 8 lines to connect the input ends, and each line transmits a first operation code or a second operation code, which saves the line track and area, and facilitates the improvement of the decoding speed.

In order to understand the decoding circuit, taking the decoding circuit corresponding to the byte 5 as an example, the decoding circuit will be described in more detail below in combination with the working principle of the decoding circuit.

If the outputs of the 8 second AND gate circuits 304 are all 0, it indicates that there is no error in all data in this byte.

If the outputs of the 8 second AND gate circuits 304 have one 1, it indicates that a bit of data in the byte has an error. Specifically, the data of the byte has an error; the second operation codes p23, p24 and p26 are all 1, and the output of the first AND gate circuit 302 is 1; and the unselected operation codes p25 and p27 are both 0, and the output of the NOR gate circuit 303 is 1. This moment, seeing corresponding to which first decoding signal the output of the second AND gate circuit 304 is 1 in the N second AND gate circuits 304, the data of the bit corresponding to the first decoding signal has an error.

It is to be understood that in the embodiment, taking the corresponding bit of data having an error when the first decoding signal is 1 as an example, the corresponding bit of data has no error when the first decoding signal is 0. In another embodiment, it may also be set that if the first decoding signal is 0, the corresponding bit of data has an error, and if the first decoding signal is 1, the corresponding bit of data has no error. Accordingly, other parts may be designed by those skilled in the art as needed, for example, the first decoding signal being connected to the NOR gate circuit and output.

It is to be noted that if none of the data in the M bytes has an error and only one bit of the X first check codes has an error, one of the first operation codes will be 1, and then one of the outputs of the decoder 301 will be 1. However, since the Y second check codes have no error, all the second operation codes will be 0. Then the output of the first AND gate circuit 302 is 0, and the output of the second AND gate circuit 304 is also 0, which indicates that none of the data in the M bytes has an error. If none of the data in the M bytes has an error and only one bit of the Y first check codes has an error, the first operation codes are all 0, and then the 0 output end of the decoder 301 is 1. However, since the Y−1 second check codes have no error, the corresponding Y−1 second operation codes are 0, the output of the first AND circuit 302 is 0, and then the outputs of the second AND gate circuits 304 are also all 0, which indicates that none of the data in the M bytes has an error.

The embodiment provides a storage system with superior structure and performance. ECC is implemented through the special design of the encoding circuit 102, which can not only detect and correct the 1-bit error (if the 1-bit error is located in the data rather than the check codes), but also detect the 2-bit error, and also reduce the hardware circuit. Thus, the power consumption of the storage system is reduced and the encoding speed and decoding speed are improved. In addition, through the special design of the first check codes and the second check codes, the difference in encoding time for all data combinations is small, and the difference in decoding time for all data combinations is also small, thus reducing the requirements of the control circuit.

Those skilled in the art may understand that the above implementation modes are specific embodiments to implement the present disclosure. However, in practice, various variations may be made in form and details without departing from the spirit and scope of the present disclosure. Any person skilled in the art may make variations and modifications without departing from the spirit and scope of the present disclosure. Therefore, the scope of protection of the present disclosure shall be subject to the scope defined in the claims.

What is claimed is:

1. A storage system, comprising:
a memory, configured to write or read a plurality of data bits during a read-write operation, the plurality of data bits being divided into M bytes, and each byte having N data bits; and
an encoding circuit, configured to:
generate X first check codes based on two or more data bits of the plurality of data bits in each byte in an encoding stage, bit locations of the two or more data bits corresponding to a same first check code being identical in different bytes;
generate Y second check codes based on all data of two or more bytes of the M bytes in the encoding stage; and
generate a third check code based on the plurality of data bits, the X first check codes and the Y second check codes;
wherein the X first check codes, the Y second check codes and the third check code are used to determine an error state of the plurality of data bits; and
wherein when the plurality of data bits have a 1-bit error, the Y second check codes are used to locate a specific byte having the 1-bit error, and
the X first check codes are used to locate a specific bit having the 1-bit error; and
wherein M, N, X, and Y are all positive natural numbers.

2. The storage system of claim 1, wherein the encoding circuit comprises: a first encoding circuit configured to generate the X first check codes, the X first check codes constitutes X bits of first binary numbers; and wherein $2^X \geq N$, each first check code is obtained by executing a first encoding operation on the one or more data bits in respective bytes, and a bit location combination in the byte corresponding to the two or more data bits corresponding to any first check code is different from a bit location combination corresponding to the two or more data bits corresponding to other first check code.

3. The storage system of claim 2, wherein the N data bits are located in 0th to (N−1)th bits incremented in accordance with natural numbers, and a first check code set obtained by selecting any bit for the first encoding operation is different from a first check code set obtained by selecting other bit for the first encoding operation.

4. The storage system of claim 2, wherein N is 8, X is 3, and the first encoding operation comprising XOR or XNOR; and the first encoding circuit is configured such that in X bits of first binary numbers, the first check code at a lowest bit is XOR or XNOR of data in a 1st, 3rd, 5th and 7th bits in all the bytes, the first check code at a highest bit is XOR or XNOR of data of a 4th, 5th, 6th and 7th bits in all the bytes, and the first check code at a middle bit is XOR or XNOR of data of a 2nd, 3rd, 6th and 7th bits in all the bytes.

5. The storage system of claim 2, wherein the encoding circuit further comprises: a second encoding circuit configured to generate Y second check codes, the Y second check codes constitutes Y bits of second binary numbers;

wherein $2^Y \geq M$, each second check code is obtained by executing a second encoding operation on two or more bytes of the M bytes.

6. The storage system of claim 5, wherein the second encoding operation comprises XNOR or XOR; wherein the second encoding circuit comprises:

a first-level operation circuit, configured to execute XOR or XNOR on all data of two selected bytes and store two or more first operation results, each first operation result being an XOR result or an XNOR result of the two selected bytes; and a second-level operation circuit, configured to execute XOR or XNOR on at least two of the first operation results, generate second check codes, and generate Y second check codes based on different encoding requirements.

7. The storage system of claim 6, wherein the first-level operation circuit comprises: a first operation sub-circuit, configured to execute XOR or XNOR on all data of a same byte and store second operation results; and a second operation sub-circuit, configured to execute XOR or XNOR on two of the second operation results and obtain a first operation result.

8. The storage system of claim 5, wherein the second encoding circuit is configured such that a number of times that each byte participates in the second encoding operation is α, α satisfies: $(Y-1)/2 \alpha (Y+1)/2$, and α is an integer greater than or equal to 0.

9. The storage system of claim 8, wherein M is 16, Y is 5; wherein the M bytes are divided into 0th to 15th bytes incremented in accordance with natural numbers, the Y second check codes being divided into 3rd to 7th second check codes incremented in accordance with natural numbers;

wherein the 3rd second check code is XOR or XNOR of all data of 0th, 2nd, 3rd, 4th, 5th, 6th, and 8th bytes, the 4th second check code is XOR or XNOR of all data of 0th, 1st, 4th, 5th, 7th, 9th, 10th, and 12th bytes, the 5th second check code is XOR or XNOR of all data of 1st, 2nd, 4th, 6th, 9th, 11th, 13th, and 14th bytes, the 6th second check code is XOR or XNOR of all data of 3rd, 5th, 6th, 7th, 10th, 11th, 14th, and 15th bytes, and the 7th second check code is XOR or XNOR of all data of 8th, 9th, 10th, 11th, 12th, 13th, and 15th bytes.

10. The storage system of claim 5, wherein the encoding circuit further comprises:

a third encoding circuit connected with an output end of the first encoding circuit and an output end of the second encoding circuit, and configured to receive the plurality of data bits and generate the third check code, and the third check code is obtained by executing a fifth encoding operation on the plurality of data bits, the X first check codes and the Y second check codes.

11. The storage system of claim 2, wherein the encoding circuit comprises: a comparison circuit, configured to execute the XOR or XNOR on all data of any two bytes or execute XOR or XNOR on the two or more data bits.

12. The storage system of claim 11, wherein the comparison circuit comprises:

a first common circuit, connected to a power signal and controlling outputting of the power signal based on a first signal and a second signal, the first signal being inverted with respect to the second signal;

a second common circuit, connected to a grounding signal and controlling outputting of the grounding signal based on the first signal and the second signal;

a first logic circuit, connected between the first common circuit and the second common circuit, configured to receive a third signal and a fourth signal, the third signal being inverted with respect to the fourth signal, and configured to output a first operation signal, the first operation signal being XOR of the first signal and the third signal; and a second logic circuit, connected between the first common circuit and the second common circuit, configured to receive the third signal and the fourth signal and output a second operation signal, the second operation signal being XNOR of the first signal and the third signal.

13. The storage system of claim 12, wherein the first common circuit comprises:

a zeroth PMOS transistor, having a gate for receiving the first signal and a source connected to the power signal; and a seventh PMOS transistor, having a gate for receiving the second signal and a source connected to the power signal;

and wherein the second common circuit comprises:

a zeroth NMOS transistor, having a gate for receiving the first signal and a source connected to the grounding signal; and a seventh NMOS transistor, having a gate for receiving the second signal and a source connected to the grounding signal.

14. The storage system of claim 13, wherein the first logic circuit comprises:
- a first PMOS transistor, having a gate for receiving the fourth signal and a source connected to a drain of the zeroth PMOS transistor;
- a first NMOS transistor, having a gate for receiving the third signal, a drain connected to a drain of the first PMOS transistor, and a source connected to a drain of the zeroth NMOS transistor;
- a fourth PMOS transistor, having a gate for receiving the third signal, and a source connected to a drain of the seventh PMOS transistor; and
- a fourth NMOS transistor, having a gate for receiving the fourth signal, a drain connected to a drain of the fourth PMOS transistor, and a source connected to a drain of the seventh NMOS transistor.

15. The storage system of claim 13, wherein the second logic circuit comprises:
- a second PMOS transistor, having a gate for receiving the third signal, and a source connected to the drain of the zeroth PMOS transistor;
- a second NMOS transistor, having a gate for receiving the fourth signal, a drain connected to the drain of the second PMOS transistor, and a source connected to the drain of the zeroth NMOS transistor;
- a fifth PMOS transistor, having a gate for receiving the fourth signal, and a source connected to the drain of the seventh PMOS transistor; and
- a fifth NMOS transistor, having a gate for receiving the third signal, a drain connected to a drain of the fifth PMOS transistor, and a source connected to a drain of the seventh NMOS transistor.

16. The storage system of claim 1, wherein the encoding circuit is further configured to;
- receive a plurality of transmitted data bits, the X first check codes and the Y second check codes in a decoding stage,
- execute a third encoding operation based on the two or more data bits in each byte and the X first check codes to generate X first operation codes, and
- execute a fourth encoding operation based on all data of two or more bytes of the M bytes and the Y second check codes to generate Y second operation codes.

17. The storage system of claim 16, wherein the encoding circuit is further configured to:
- receive a plurality of transmitted data bits, the X first check codes, the Y second check codes and the third check code in the decoding stage, and
- execute a sixth encoding operation based on the plurality of transmitted data bits, the X first check codes, the Y second check codes and the third check code to generate a third operation code, and the storage further comprises:
- a decoding circuit, configured to receive the X first operation codes, the Y second operation codes and the third operation code and locate data having an error.

18. The storage system of claim 17, wherein the decoding circuit comprises:
- an error state determination circuit, configured to execute decoding processing on the X first operation codes, the Y second operation codes and the third operation code to identify a current error state; and
- M decoding circuits, each decoding circuit corresponding to a byte, configured to execute decoding processing on the X first operation codes and the Y second operation codes to obtain whether there is data having an error in the byte and locate a bit where the data having an error locates.

19. The storage system of claim 18, wherein the decoding circuit comprises:
- a decoder, configured to receive the X first operation codes and output N first decoding signals, each first decoding signal corresponding to a bit of the N data bits;
- a first AND gate circuit, configured to receive at least two selected operation codes and execute a logic AND operation, the selected operation codes being the second operation codes obtained by executing the fourth encoding operation on the second check codes corresponding to the corresponding bytes in the Y second check codes;
- a NOR gate circuit, configured to receive at least two unselected operation codes and execute a logic NOR operation, the unselected operation codes being the second operation codes except the selected operation codes corresponding to the corresponding bytes; and
- N second AND gate circuits, an input end of each second AND gate circuit being connected with an output end of the first AND gate circuit, an output end of the NOR gate circuit and the first decoding signal, and a position of data having an error being obtained based on an output of the N second AND gate circuits.

20. The storage system of claim 19, wherein
the first AND gate circuit has three input ends;
wherein the first AND gate circuit is further configured such that an input end of the first AND gate circuit is connected with a power source when a number of the selected operation codes is 2, or the NOR gate circuit has three input ends;
wherein the NOR gate circuit is further configured such that an input end of the NOR gate circuit is grounded when a number of the unselected operation codes is 2.

* * * * *